(12) United States Patent
West et al.

(10) Patent No.: US 7,834,574 B2
(45) Date of Patent: Nov. 16, 2010

(54) PHASE CURRENT SAMPLING AND REGULATING APPARATUS AND METHODS, AND ELECTRIC MOTOR DRIVE SYSTEMS

(75) Inventors: Stephen T. West, New Palestine, IN (US); Brian A. Welchko, Torrance, CA (US); Steven E. Schulz, Torrance, CA (US); Silva Hiti, Redondo Beach, CA (US)

(73) Assignee: GM Global Technology Operations, Inc., Detroit, MI (US)

( * ) Notice: Subject to any disclaimer, the term of this patent is extended or adjusted under 35 U.S.C. 154(b) by 431 days.

(21) Appl. No.: 11/944,781

(22) Filed: Nov. 26, 2007

(65) Prior Publication Data

US 2009/0134833 A1    May 28, 2009

(51) Int. Cl.
   *H02P 1/32* (2006.01)
(52) U.S. Cl. .................. 318/496; 318/494; 318/714; 318/720; 318/801
(58) Field of Classification Search .......... 318/801, 318/803, 432, 434, 437, 494, 496, 714, 715, 318/720, 721, 722, 724; 341/116, 129, 133, 341/136, 155
See application file for complete search history.

(56) References Cited

U.S. PATENT DOCUMENTS

| | | | | |
|---|---|---|---|---|
| 4,611,159 A | * | 9/1986 | Kurakake et al. | ........... 318/803 |
| 6,459,230 B1 | * | 10/2002 | Tao | ............................. 318/798 |
| 7,049,778 B2 | * | 5/2006 | Katanaya | ............... 318/400.04 |
| 7,119,530 B2 | * | 10/2006 | Mir et al. | ................. 324/76.15 |
| 7,148,828 B2 | * | 12/2006 | Fernandez et al. | .......... 341/120 |
| 7,193,388 B1 | * | 3/2007 | Skinner et al. | .............. 318/811 |

* cited by examiner

*Primary Examiner*—Walter Benson
*Assistant Examiner*—Thai Dinh
(74) *Attorney, Agent, or Firm*—Ingrassia Fisher & Lorenz, P.C.

(57) ABSTRACT

In various embodiments, a phase current sampling apparatus (300, 600, FIGS. 3, 6), an electric motor drive system (100, FIG. 1), and a motor vehicle (1200, FIG. 12) include switching circuitry adapted to receive first and second phase current waveforms. The switching circuitry provides the first phase current waveform during at least two offset sampling instants, and provides the second phase current waveform during a reference sampling instant. An analog-to-digital converter is adapted to sample the first phase current waveform at the offset sampling instants, and to sample the second phase current waveform at the reference sampling instant. An embodiment of a method for regulating phase current waveforms includes an analog-to-digital converter generating samples of a first phase current waveform at sampling instants that occur before and after a reference sampling instant, and generating a sample of a second phase current waveform at the reference sampling instant.

19 Claims, 8 Drawing Sheets

PHASE CURRENT SAMPLING AND REGULATING APPARATUS AND METHODS, AND ELECTRIC MOTOR DRIVE SYSTEMS

TECHNICAL FIELD

The inventive subject matter generally relates to apparatus and methods for sampling phase currents, and more particularly relates to such apparatus and methods incorporated into electric motor drive systems.

BACKGROUND

Electric drives are used to control the phase currents of electric motors. In a digitally-controlled system, multiple phase currents typically are sampled simultaneously and converted into digital values using analog-to-digital (A-to-D) converters. These digital values are provided to a system controller, which may adjust the phase currents according to the digital values.

In some systems, multiple analog-to-digital (A-to-D) converters may be used simultaneously to sample the multiple phase currents. For example, in a system which provides three-phase current, three A-to-D converters may be implemented in parallel sampling channels. The sampling instants for each phase current typically are controlled with precision, which may enable detection and reduction of aliasing that may be introduced by phase ripple current.

In some cases, fewer A-to-D converters may be available than the number of phase currents. For example, the system may include fewer A-to-D converters than the number of phase currents or the system may, at various times, use one or more of the A-to-D converters normally used for sampling phase currents for other purposes. At these times, the system controller may not receive a sampled current value for each phase current, and accurate control of the phase currents may be compromised. The sampling errors introduced may be reflected back into the phase currents, resulting in significant torque ripple, current harmonics, and/or other undesirable artifacts that may detrimentally affect the performance of the electric motor.

Accordingly, it is desirable to provide apparatus and methods for sampling phase currents of an electric motor that may use fewer A-to-D converters than the number of phase currents, where the apparatus and methods introduce less torque ripple, current harmonics, and/or other undesirable artifacts that may be introduced using conventional apparatus and methods. Furthermore, other desirable features and characteristics of the inventive subject matter will become apparent from the subsequent detailed description and the appended claims, taken in conjunction with the accompanying drawings and the foregoing technical field and background.

BRIEF SUMMARY

In an embodiment, a phase current sampling apparatus is provided, which includes switching circuitry and a first analog-to-digital converter. The switching circuitry has multiple input terminals and an output terminal, and is adapted to receive multiple phase current waveforms that include at least a first phase current waveform and a second phase current waveform. The switching circuitry is also adapted to provide the first phase current waveform at the output terminal during at least two offset sampling instants, and to provide the second phase current waveform at the output terminal during a reference sampling instant. The first analog-to-digital converter is adapted to receive the first phase current waveform and the second phase current waveform, and to generate digital values representing amplitudes of the first phase current waveform at the offset sampling instants, and to generate a digital value representing an amplitude of the second phase current waveform at the reference sampling instant.

In another embodiment, an electric motor drive system is provided, which includes an inverter, and a phase current sampling apparatus as described in the embodiment in the previous paragraph, and a controller. The inverter is adapted to generate, based on inverter control inputs, multiple phase current waveforms, which include at least a first phase current waveform and a second phase current waveform. The controller is adapted to receive the digital values representing the amplitudes of the first phase current waveform, and to calculate an approximate value for the first phase current waveform from the digital values representing the amplitudes of the first phase current waveform.

In another embodiment, a motor vehicle is provided, which includes an electric motor, and an electric motor drive system as described in the embodiment in the previous paragraph. The electric motor is adapted to receive multiple phase current waveforms and to provide torque in response to the multiple phase current waveforms, which include at least a first phase current waveform and a second phase current waveform.

In another embodiment, a method is provided for regulating phase current waveforms. The method includes the step of generating, by a first analog-to-digital converter, a first sample of a first phase current waveform at a first offset sampling instant that occurs a first timing offset, tx1, before a reference sampling instant, t0. The method also includes the steps of generating, by the first analog-to-digital converter, a second sample of a second phase current waveform at the reference sampling instant, and generating, by the first analog-to-digital converter, a third sample of the first phase current waveform at a second offset sampling instant that occurs a second timing offset, tx2, after the reference sampling instant.

BRIEF DESCRIPTION OF THE DRAWINGS

Embodiments of the inventive subject matter will hereinafter be described in conjunction with the following drawing figures, wherein like numerals denote like elements.

DETAILED DESCRIPTION

The following detailed description is merely exemplary in nature and is not intended to limit the inventive subject matter or the application and uses of the inventive subject matter. Furthermore, there is no intention to be bound by any expressed or implied theory presented in the preceding technical field, background, brief summary or the following detailed description.

Figure 1:
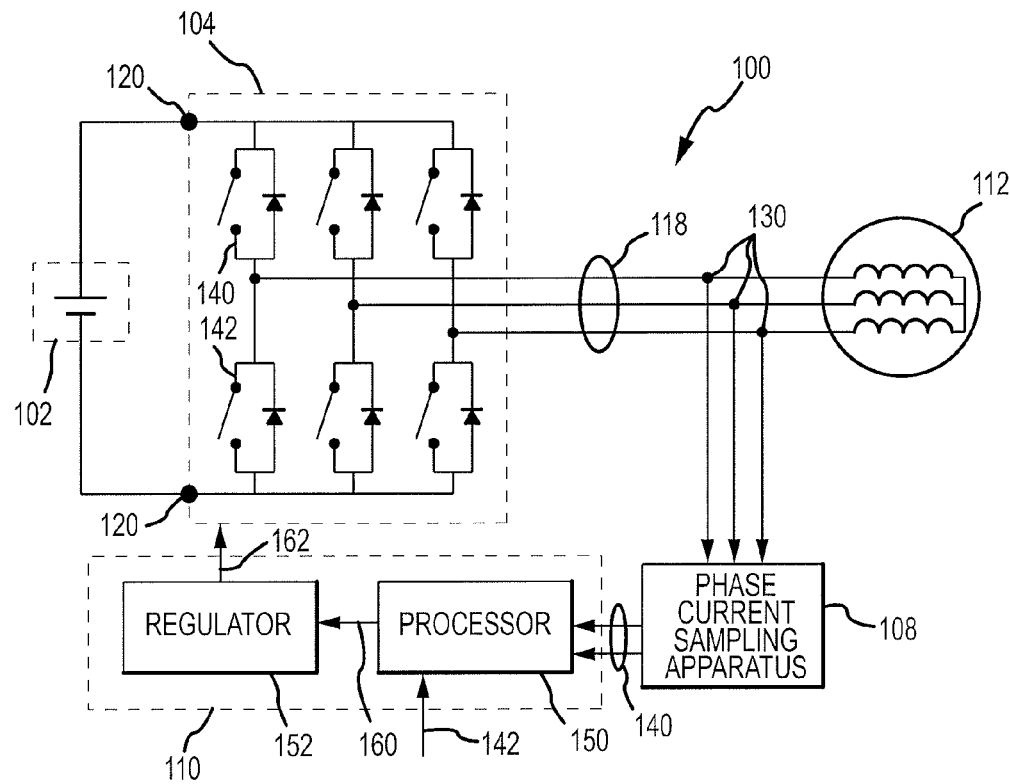
FIG. 1 illustrates a simplified schematic diagram of an electric motor drive system, in accordance with an example embodiment of the inventive subject matter.

FIG. 1 illustrates a simplified schematic diagram of an electric motor drive system 100, in accordance with an example embodiment of the inventive subject matter. System 100 includes a power source 102, an inverter 104, a phase current sampling apparatus 108, and a controller 110, which are adapted to drive an electric motor 112, in an embodiment. As will be described in more detail below, electric motor drive system 100 is adapted to induce multiple phase current waveforms 118, to sample and analyze the multiple phase current waveforms 118, and to control generation of the phase current waveforms 118 based on the sampling and analysis.

In an embodiment, system 100 is a three-phase system, in which inverter 104 generates three phase current waveforms 118, and motor 112 is a three-phase electric motor. In other embodiments, system 100 may be a two-phase system or a multiple-phase (e.g., greater than three-phase) system, and motor 112 may be appropriately adapted. Although the description herein discusses apparatus and methods adapted for a three-phase system, it is to be understood that the inventive subject matter is not intended to be limited to methods and apparatus specifically adapted for three-phase systems.

Power source 102 includes one or more rechargeable power sources (e.g., batteries or capacitors), in an embodiment. In an alternate embodiment, power source 102 may include one or more alternative power sources, such as a line power source, for example. Power source 102 generates a direct current (DC) voltage across inverter input terminals 120. The voltage may have a magnitude in a range of 100-400 V, in an embodiment, although the voltage may be higher or lower, in other embodiments.

Power source 102 is operably coupled to inverter 104 via the inverter input terminals 120. Inverter 104 includes a circuit, which is adapted to receive the voltage from power source 102 and to convert the voltage into N substantially sinusoidal fundamental phase voltage waveforms, which induce phase current waveforms 118, where N=3, in an embodiment. In an embodiment, the phase current waveforms 118 have substantially equal phase separations with respect to each other (e.g., phase separations of about 120°).

In an embodiment, inverter 104 includes N phase legs, each of which generates a phase voltage and includes a pair of switching elements that includes an upper switching element 140 and a lower switching element 142. Each pair of switching elements 140, 142 is switched in a complementary manner between open switch states and closed switch states, and the duty cycle for the open and closed switch states is controlled by inverter control inputs 162 generated by controller 110. Accordingly, controller 110 is adapted to cause each phase leg of inverter 104 to pulse width modulate the input voltage to generate a sinusoidal, pulse width modulated (PWM) phase voltage waveform 118. Through control of the switching elements 140, 142, the amplitude, frequency, and relative phase of each of the phase current waveforms 118 is controllable, as will be described in more detail later. In an embodiment, the switching frequency of switching elements 140, 142 is a frequency in a range of about 2 kiloHertz (kHz) to about 20 kHz, although lower or higher switching frequencies may be used in other embodiments. Through control of the switching frequency of each switching element 140, 142 and the duty cycle within each phase leg, the fundamental frequency of phase current waveforms 118 is controllable within a range of 0 Hz to 2 kHz, in an embodiment, although lower or higher fundamental phase current waveform frequencies may be produced in other embodiments.

Figure 2:
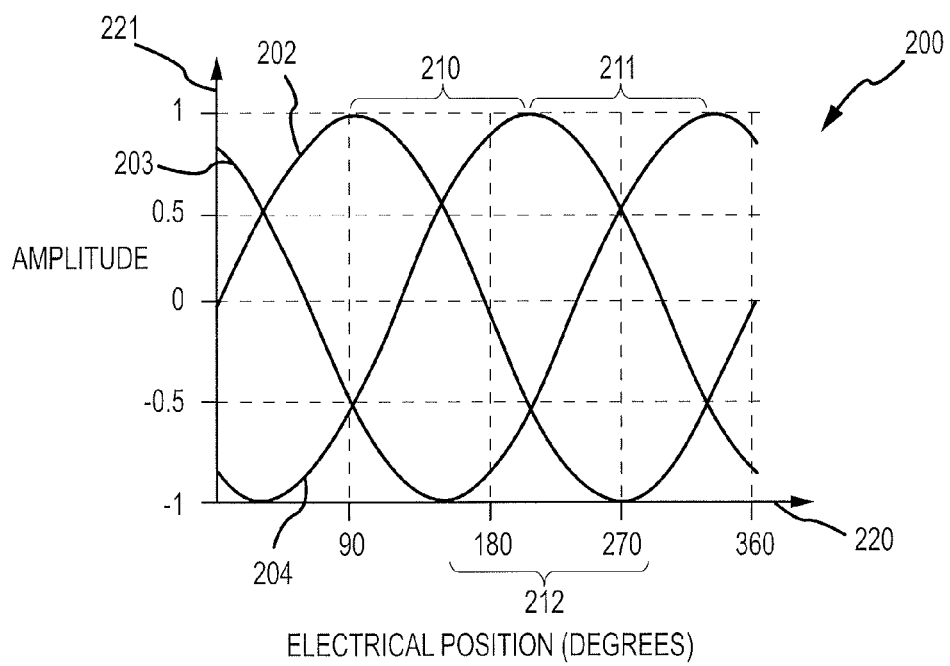
FIG. 2 illustrates a chart of three, sinusoidal phase current waveforms.

FIG. 2 illustrates a chart 200 of three, sinusoidal phase current waveforms 202, 203, 204. The axes of chart 200 include an electrical position axis 220 and an amplitude axis 221. In an embodiment, the phase separations 210, 211, 212 between adjacent phase current waveforms 202-204 are substantially equal, or about 120°. The fundamental frequency of each phase current waveform 202-204 also is substantially equal, although the fundamental frequency may be varied over time. Although not reflected in FIG. 2, each phase current waveform 202-204 may include a phase ripple current component having a frequency related to the switching frequency of the switching elements (e.g., switching elements 140, 142).

Referring again to FIG. 1, the N phase current waveforms 118 are provided to motor 112 at motor input terminals 130. In an embodiment, motor 102 is an N-phase electric motor adapted to receive N phase current waveforms, and to generate torque in response to the received phase current waveforms. For example, motor 112 may be an electric motor embodied in an electric vehicle or a hybrid electric vehicle (HEV). In other embodiments, motor 112 may be embodied in another type of system, such as an industrial system or another type of motion control system, for example.

Phase current sampling apparatus 108 and controller 110 together form a feedback and control sub-system. In an embodiment, the feedback and control sub-system is adapted to control the phase current waveforms 118 generated by inverter 104, in order to control the torque generation of motor 112. In particular, the feedback and control sub-system is adapted to sample the phase current waveforms 118, to compare characteristics of the sampled phase current waveforms with desired phase current waveform parameters, and to control the switch states of switching elements 140, 142 in response to the comparison. As used herein, the term "sample," in its verb tense, means to convert an analog waveform amplitude at a discrete time into a digital value. The term "sample," in its noun tense means a digital value that reflects an amplitude of an analog waveform at a discrete time.

In an embodiment, phase current sampling apparatus 108 includes M "sampling channels," and is adapted to receive and sample each of the phase current waveforms 118 and to generate M streams 140 of phase current waveform samples, where M<N, in an embodiment. In other words, phase current sampling apparatus 108 includes a number, M, of sampling channels that is less than a number, N, of phase current waveforms 118. In a particular embodiment, M=N−1, N=3, and M=2. In another embodiment, M=N−2, N=3, and M=1.

In still other embodiments, N and M may have other values and mathematical relationships, as long as the condition that M<N is met.

As used herein, a "sampling channel" includes circuitry (e.g., including an analog-to-digital converter) adapted to sample amplitudes of an analog phase current waveform at a plurality of sampling instants, and to generate a stream 140 of phase current waveform samples. Each stream 140 includes a plurality of digital values reflecting the sampled amplitudes of one or more phase current waveforms. An embodiment of a simplified block diagram of a phase current sampling apparatus will be described in more detail in conjunction with FIG. 3, later.

Controller 110 includes at least one processor 150, and a regulator 152, in an embodiment. Processor 150 is adapted to receive and analyze the M streams 140 of phase current waveform samples 140 (referred to herein as "measured phase current waveforms"), and to compare characteristics of the measured phase current waveforms with desired phase current waveform parameters. In an embodiment, desired phase current waveform parameters may be received from other system elements (not illustrated) via input commands 142, and these parameters may be stored in local memory or other memory that is accessible to controller 110. Desired phase current waveform parameters may include, for example, parameters regarding phase current waveform amplitude, frequency, and relative phase. Based on errors calculated between the measured phase current waveform parameters and the desired phase current waveform parameters, processor 150 generates regulator control inputs 160 adapted to reduce the errors.

Regulator 152 is adapted to receive the regulator control inputs 160 and to generate inverter control inputs 162, accordingly. The inverter control inputs 162 determine the duty cycles of the switching elements 140, 142 for each of the phase legs, thus controlling the fundamental sinusoidal component of each phase current waveform 118 and the relative phase between the phase current waveforms 118.

Figure 3:
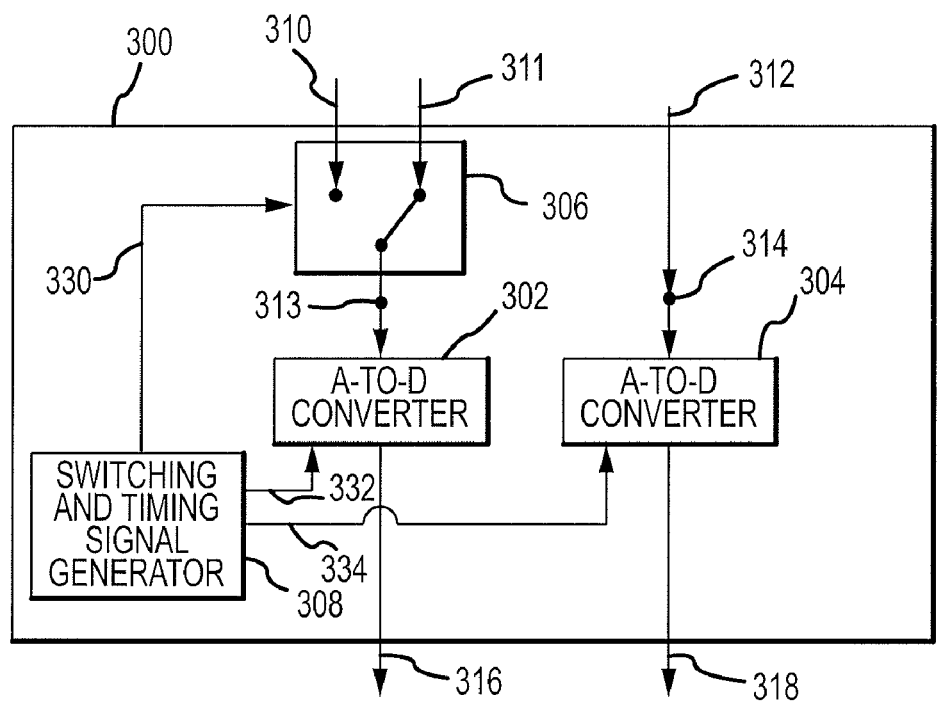
FIG. 3 illustrates a simplified schematic diagram of a phase current sampling apparatus, in accordance with an example embodiment.

FIG. 3 illustrates a simplified schematic diagram of a phase current sampling apparatus 300 (e.g., phase current sampling apparatus 108, FIG. 1), in accordance with an example embodiment. Phase current sampling apparatus 300 includes at least one analog-to-digital (A-to-D) converter 302, 304, switching circuitry 306, and at least one switching and timing signal generator 308, in an embodiment.

Phase current sampling apparatus 300 receives the N phase current waveforms 310, 311, 312 (e.g., phase current waveforms 118, FIG. 1), and generates multiple sets of "corresponding samples" for each of the N phase current waveforms 310-312. A set of "corresponding samples" includes samples of each of the N phase current waveforms 310-312 that are generated at sampling instants that relate to a given reference sampling instant, referred to herein as "t0". For a given set of corresponding samples, one or more of the phase current waveforms 310-312 are sampled substantially simultaneously at the reference sampling instant, t0, and one or more other ones of the phase current waveforms 310-312 are sampled at two "offset" sampling instants, one of which occurs before the reference sampling instant, and the other of which occurs after the reference sampling instant. In an embodiment, the two offset sampling instants occur at substantially symmetrical timing offsets before and after the reference sampling instant. In another embodiment, the two offset sampling instants occur at non-symmetrical timing offsets before and after the reference sampling instant.

Two A-to-D converters 302, 304 are illustrated in FIG. 3, which correspond to a particular embodiment. In other embodiments, phase current sampling apparatus may include more or fewer A-to-D converters. In addition, the two A-to-D converters 302, 304 illustrated indicate A-to-D converters that are operable, in accordance with various embodiments, during a particular time period. During other time periods, alternate A-to-D converters (not illustrated) present within the system may be operable, in accordance with various embodiments.

Each A-to-D converter 302, 304 forms a portion of a sampling channel, and is adapted to sample a phase current waveform 310-312 present at its input terminal 313, 314, and to generate a stream 316, 318 of digital waveform samples, which include the sets of corresponding samples. In an embodiment, at least one A-to-D converter (e.g., A-to-D converter 302) is electrically coupled to switching circuitry 306.

Switching circuitry 306 may include, for example, circuitry adapted to receive multiple phase current waveforms at its input terminals, and to produce one of the received phase current waveforms at its output terminal. Although the switching circuitry 306 is illustrated in a manner that may imply that they it includes physical switches, switching circuitry 306 may include electrical switches (e.g., semiconductor-based switches) and/or may be implemented by a processing element in conjunction with software or firmware.

In an embodiment, switching circuitry 306 is adapted to receive at least two of the phase current waveforms (e.g., phase current waveforms 310 and 311), and depending on the position of the switching circuitry 306, to provide one of the received phase current waveforms (e.g., phase current waveform 310 or 311) to one of the A-to-D converters (e.g., A-to-D converter 302). Accordingly, a first A-to-D converter (e.g., A-to-D converter 302), in conjunction with switching circuitry 306, is adapted to sample multiple ones of the phase current waveforms (e.g., phase current waveforms 310, 311). A second A-to-D converter (e.g., A-to-D converter 304) may directly receive a phase current waveform (e.g., phase current waveform 312).

Switching and timing signal generator 308 is adapted to provide switching inputs 330 to switching circuitry 306, which cause switching circuitry 306 to produce one of the received phase current waveforms at its output terminal. In addition, switching and timing signal generator 308 is adapted to provide sample timing signals 332, 334 to each A-to-D converter 302, 304, which control the sampling instants at which each A-to-D converter 302, 304 will sample the phase current waveform present at its input terminal 313, 314.

Figure 4:
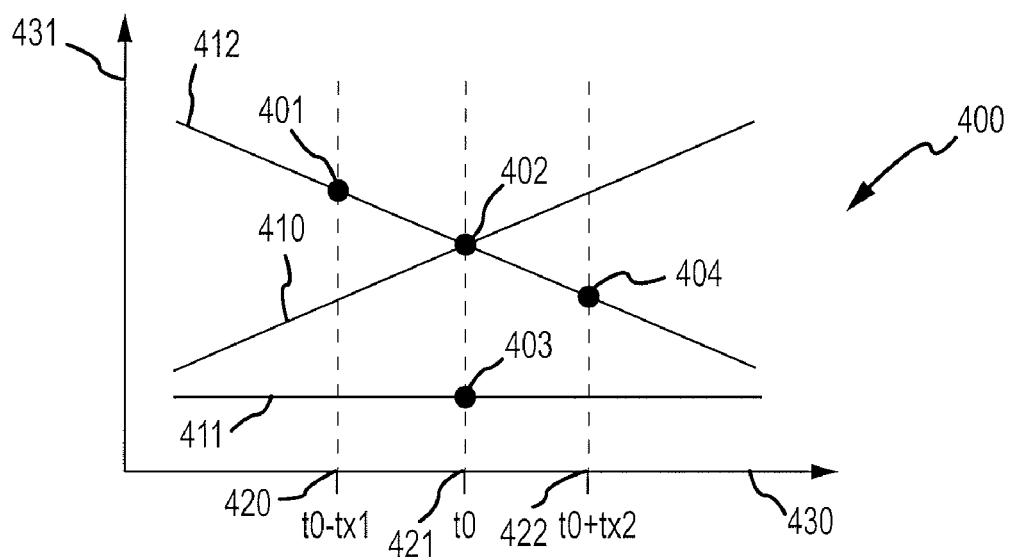
FIG. 4 is a chart illustrating sample points along three phase current waveforms, in accordance with an example embodiment.

FIG. 4 is a chart 400 illustrating sample points 401, 402, 403, 404 along three phase current waveforms 410, 411, 412, where the sample points 401-404 correspond to various sampling instants 420, 421, 422, in accordance with an example embodiment. The axes of chart 400 include a time axis 430 and an amplitude axis 431. Chart 400 illustrates portions phase current waveforms 410-412 that are substantially shorter than the period of each phase current waveform 410-412.

Sampling instant 421 represents a reference sampling instant, t0. Substantially simultaneously with the reference sampling instant 421, samples of two phase current waveforms 410, 411 are generated, as indicated by sample points 402, 403. In an embodiment, these samples are generated substantially simultaneously with each other and with the reference sampling instant, t0, and accordingly may be referred to herein as "substantially simultaneous samples" or "reference samples." The phase current waveforms 410, 411 that are synchronously sampled may be referred to herein as "synchronously sampled phase current waveforms" or "SS phase current waveforms." The substantially simultaneous samples each are generated using a distinct sampling channel, in an embodiment. For example, referring also to FIG. 3, switching and timing signal generator 308 may provide simultaneous sample timing signals 332, 334 that cause each A-to-D converter 302, 304 to generate a sample of the phase current waveform present at its input terminal 313, 314. The phase current waveform present at the input terminal 313 of A-to-D converter 302 depends on the state of switching circuitry 306. In the state illustrated in FIG. 3, phase current waveform 311 will be present at the input terminal 313 of A-to-D converter 302.

Sample points 401, 404 correspond to samples of the third phase current waveform 412. Sampling instant 420 represents a sampling instant, t0−tx1, which occurs before the reference sampling instant, t0, and sampling instant 422 represents a sampling instant, t0+tx2, which occurs after the reference sampling instant, t0. Accordingly, sampling instants 420, 422 may be referred to herein as "offset" sampling instants, and the samples corresponding to the offset sampling instants may be referred to as "offset samples." The phase current waveform 412 that is not synchronously sampled with the other phase current waveforms may be referred to herein as a "non-synchronously sampled phase current waveform" or "NSS phase current waveform."

The values tx1 and tx2 are referred to herein as "sample timing offsets." Sample timing offsets, tx1 and tx2, are values in a range of about 5% to about 10% of the period of phase current waveforms 410-412, in an embodiment, although the sample timing offsets may be longer or shorter, in other embodiments. In an embodiment tx1=tx2, and accordingly sampling instants 420 and 422 occur symmetrically, in time, before and after the reference timing instant, t0. In other embodiments, the sample timing offsets, tx1 and tx2, may be unequal, and accordingly sampling instants 420 and 422 may occur asymmetrically, in time, before and after the reference timing instant, t0.

In an embodiment, the offset samples corresponding to sample points 401 and 404 are generated using a sampling channel that is adapted to receive the third phase current waveform 412. For example, referring again to FIG. 3, switching and timing signal generator 308 may provide a switching input 330 to switching circuitry 306, which causes switching circuitry 306 to produce the third phase current waveform. For example, the switching circuitry 306 may be sequentially controlled as follows:

1) Prior to offset sampling instant 420, the state of switching circuitry 306 may be switched so that phase current waveform 310 will be present at the input terminal 313 of A-to-D converter 302 when offset sampling instant 420 occurs;
2) After offset sampling instant 420 and prior to reference sampling instant 421, the state of switching circuitry 306 may be switched so that phase current waveform 311 will be present at the input terminal 313 of A-to-D converter 302 when the reference sampling instant 421 occurs;
3) After reference sampling instant 421 and prior to offset sampling instant 422, the state of switching circuitry 306 may again be switched so that the phase current waveform 310 will be present at the input terminal 313 of A-to-D converter 302 when offset sampling instant 422 occurs; and
4) The process may then repeat for a next set of corresponding samples.

For one set of corresponding samples, Table 1, below, indicates the relative timing and sequence of samples that are included within the streams (e.g., streams 316, 318, FIG. 3) of samples generated by A-to-D converters 302, 304. For convenience, the samples are indicated by the reference numbers corresponding to sample points 401-404. The notation "$i_{x\_sample\_40y}$" indicates a sample value corresponding to the "xth" phase current waveform (i.e., x=1, 2 or 3) at a particular sampling instant 40y.

TABLE 1

| stream | instant | | |
|---|---|---|---|
| | t0 − tx1 | t0 | t0 + tx2 |
| stream 316 | $i_{3\_sample\_401}$ | $i_{1\_sample\_402}$ | $i_{3\_sample\_404}$ |
| stream 318 | | $i_{2\_sample\_403}$ | |

In the embodiment described above, switching circuitry 306 is adapted to provide one of multiple input phase currents to A-to-D converter 302. In an alternate embodiment, additional switching circuitry (not illustrated) may be coupled to the other A-to-D converter (e.g., A-to-D converter 304), and the additional switching circuitry also may be adapted to provide one of multiple input phase currents to the other A-to-D converter. Some or all of the input phase currents may be provided as inputs to the switching circuitry for both A-to-D converters. For example, the switching circuitry for both A-to-D converters may receive some or all of the NSS phase current waveforms and/or the SS phase current waveforms (e.g., some or all of $i_1$, $i_2$, and $i_3$). In such an embodiment, a first A-to-D converter (e.g., A-to-D converter 302) may be used to sample one of the offset samples, and a second A-to-D converter (e.g., A-to-D converter 304) could be used to sample the other offset sample. For one set of corresponding samples, Table 2, below, indicates the relative timing and sequence of samples that may be included within the streams (e.g., streams 316, 318, FIG. 3) of samples generated by A-to-D converters 302, 304.

TABLE 2

| stream | instant | | |
|---|---|---|---|
| | t0 − tx1 | t0 | t0 + tx2 |
| stream 316 | $i_{3\_sample\_401}$ | $i_{1\_sample\_402}$ | |
| stream 318 | | $i_{2\_sample\_403}$ | $i_{3\_sample\_404}$ |

Referring also to FIG. 1, the streams 140 of phase current waveform samples (e.g., streams 316, 318, FIG. 3) are received by controller 110. The phase current waveform samples that correspond to the reference sampling instant, t0 (e.g., reference sampling instant 421, FIG. 4), indicate the amplitudes of the two phase current waveforms that were sampled substantially simultaneously (e.g., phase current waveforms 410, 411, FIG. 4). The phase current waveform samples (e.g., the offset samples) that correspond to the offset sampling instants, t0−tx1 and t0+tx2 (e.g., offset sampling instants 420, 422, FIG. 4), indicate two amplitudes of the third phase current waveform, which was sampled at the offset sampling instants.

In an embodiment, processor 150 mathematically calculates an approximate amplitude value for the third phase current waveform (e.g., phase current waveform 310, FIG. 3) at the reference sampling instant, t0, based on the values of the offset samples. In a particular embodiment, processor 150 calculates the approximate amplitude value for the third phase current waveform as an average of the two offset samples for the third phase current waveform. Using the annotation specified above, the approximate amplitude value, $i_{3approx}$, for the third phase current waveform may be calculated as follows:

$$i_{3approx} = \frac{1}{2}(i_{3\_sample\_401} + i_{3\_sample\_404}).$$

In other embodiments, other linear or non-linear mathematical formulas may be used to calculate the approximate amplitude value for the third phase current waveform.

Accordingly, for a given set of corresponding samples, processor 150 produces a modified set of samples that includes a single value for each of the phase current waveforms. Two of the samples in the modified set include the received amplitude values for two of the phase current waveforms (e.g., $i_{1\_sample\_402}$ and $i_{2\_sample\_403}$), and the third sample in the set includes a calculated amplitude value for the third phase current waveform (e.g., $i_{3approx}$). Processor 150 (or controller 110) may store modified sets of samples for a plurality of reference sampling instants, and accordingly may accumulate a plurality of modified sample sets over time, and the plurality of modified sample sets represents measurements of the three phase current waveforms over time, or the measured phase current waveforms. As discussed previously, based on errors calculated between the measured phase current waveform parameters and the desired phase current waveform parameters, processor 150 generates regulator control inputs 160 adapted to reduce the errors.

Figure 5:
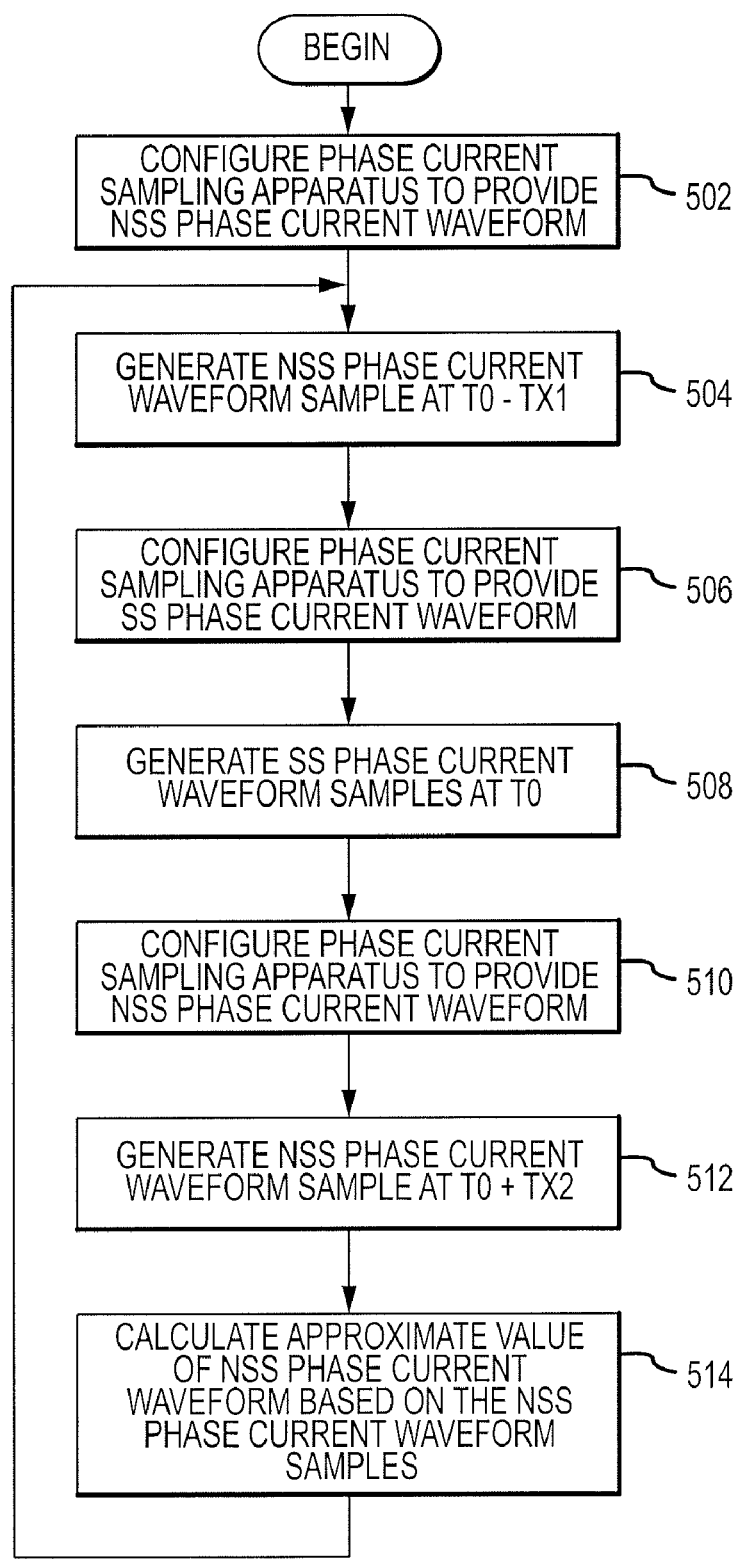
FIG. 5 illustrates a flowchart of a method for sampling phase current waveforms, in accordance with an example embodiment.

FIG. 5 illustrates a flowchart of a method for sampling phase current waveforms, in accordance with an example embodiment. The method may be performed, for example, by portions of an electric motor drive system, such as various embodiments of the electric motor drive system and portions thereof discussed previously in conjunction with FIGS. 1, 3, and 4. The method may be carried out by hardware, software, firmware, and/or various combinations thereof, in various embodiments.

The method may begin, in block 502, by configuring the phase current sampling apparatus to provide a non-synchronously sampled (NSS) phase current waveform to a first sampling channel of a phase current sampling apparatus (e.g., phase current sampling apparatus 108, FIG. 1). For example, referring also to FIGS. 1, 3, and 4, switching circuitry associated with the phase current sampling apparatus (e.g., switching circuitry 306, FIG. 3) may be controlled to provide the NSS phase current waveform at an input terminal of an A-to-D converter (e.g., A-to-D converter 302, FIG. 3) associated with the first sampling channel.

In block 504, the first sampling channel generates a first offset sample of the NSS phase current waveform at a first offset sampling instant (e.g., t0−tx1). For example, the first A-to-D converter may receive a sample timing signal (e.g., sample timing signal 332, FIG. 3), and in response to the sample timing signal, the A-to-D converter may generate a sample of the NSS phase current waveform.

In block 506, the phase current sampling apparatus may be configured to provide a first synchronously sampled (SS) phase current waveform to the first sampling channel, where the first SS phase current waveform is a different waveform from the NSS phase current waveform. For example, the switching circuitry may be controlled to provide the first SS phase current waveform at the input terminal of the A-to-D converter that was used, in block 504, to sample the NSS phase current waveform.

In block 508, the first sampling channel and a second sampling channel generate samples of the first SS phase current waveform and a second SS phase current waveform, respectively, at a reference sampling instant (e.g., t0) which occurs after the first offset sampling instant. For example, each of two A-to-D converters (e.g., A-to-D converters 302, 304, FIG. 3) may simultaneously receive sample timing signals (e.g., sample timing signals 332, 334, FIG. 3), and in response, each A-to-D converter may generate a sample of the SS phase current waveform present at its input terminal.

In block 510, the phase current sampling apparatus again may be configured to provide the NSS phase current waveform to the first sampling channel. For example, the switching circuitry may be controlled to provide the NSS phase current waveform at the input terminal of the A-to-D converter that was used, in blocks 504 and 508, to sample the NSS phase current waveform and the SS phase current waveform, respectively.

In block 512, the first sampling channel generates a second offset sample of the NSS phase current waveform at a second offset sampling instant (e.g., t0+tx2). For example, the first A-to-D converter may receive a sample timing signal (e.g., sample timing signal 332, FIG. 3), and in response to the sample timing signal, the A-to-D converter may generate a second sample of the NSS phase current waveform.

In block 514, an approximate value of the NSS phase current waveform, at the reference sampling instant, t0, may be calculated based on the first offset sample and the second offset sample of the NSS phase current waveform. As discussed previously, for example, a processor (e.g., processor 150, FIG. 1) may mathematically calculate an approximate amplitude value for the NSS phase current waveform at the reference sampling instant, t0, based on the values of the first and second offset samples. In a particular embodiment, the processor may calculate the approximate amplitude value for the NSS phase current waveform as an average of the first and second offset samples.

The approximate value of the NSS phase current waveform, along with the samples of the first SS phase current waveform and the second SS phase current waveform, form a set of samples that includes a single value for each of the phase current waveforms. Two of the samples in the modified set include the received amplitude values for the SS phase current waveforms, and the third sample in the set includes a calculated amplitude value for the NSS phase current waveform. In an embodiment, a plurality of sets of samples are generated and analyzed, and the electric motor drive system is controlled according to the analysis. Accordingly, the method may iterate, as illustrated in FIG. 5, in order to generate the plurality of sets of samples. Analysis of the samples will be discussed in more detail in conjunction with FIG. 9.

In embodiments discussed in detail above, a phase current sampling apparatus (e.g., phase current sampling apparatus 108, FIG. 1) includes M sampling channels. Embodiments of phase current sampling apparatus are adapted to receive N phase current waveforms and to generate M streams (e.g., streams 140, FIG. 1) of phase current waveform samples, where the number, M, of sampling channels is less than the number, N, of phase current waveforms, and in a particular embodiment, M=N−1, N=3, and M=2. In another embodiment, as mentioned previously, M=N−2, N=3, and M=1. Accordingly, phase current sampling apparatus may be adapted to sample three phase current waveforms using a single sampling channel.

Figure 6:
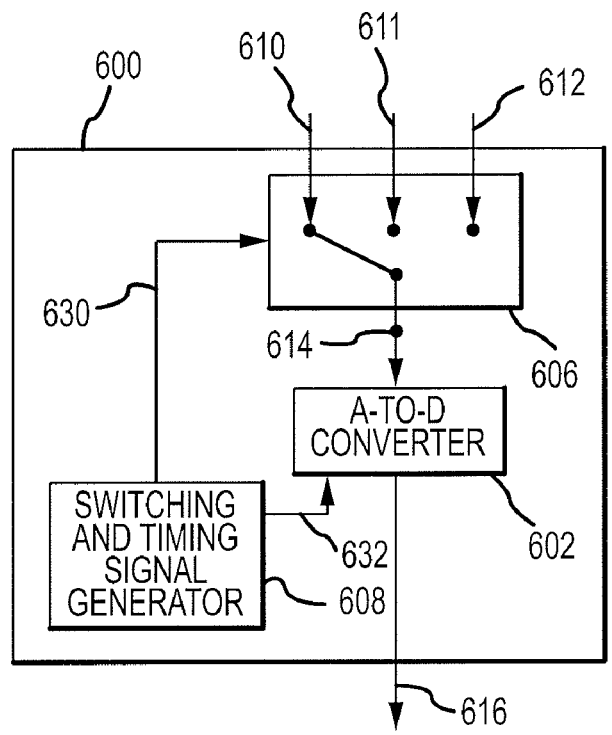
FIG. 6 illustrates a simplified schematic diagram of a phase current sampling apparatus, in accordance with another example embodiment.

FIG. 6 illustrates a simplified schematic diagram of a phase current sampling apparatus 600 (e.g., phase current sampling apparatus 108, FIG. 1), in accordance with another example embodiment. Phase current sampling apparatus 600 includes an A-to-D converter 602, switching circuitry 606, and at least one switching and timing signal generator 608, in an embodiment.

Phase current sampling apparatus 600 receives the N phase current waveforms 610, 611, 612 (e.g., phase current waveforms 118, FIG. 1), and generates multiple sets of corresponding samples for the N phase current waveforms 610-612. For a given set of corresponding samples, one of the phase current waveforms (e.g., phase current waveform 610) is sampled at the reference sampling instant, t0, and each of the other ones of the phase current waveforms (e.g., phase current waveforms 611, 612) are sampled at two "offset" sampling instants, one of which occurs before the reference sampling instant, and the other of which occurs after the reference sampling instant. In an embodiment, for a particular phase current waveform 611, 612, the two offset sampling instants occur at substantially symmetrical timing offsets before and after the reference sampling instant. In another embodiment, the two offset sampling instants occur at non-symmetrical timing offsets before and after the reference sampling instant.

A-to-D converter 602 forms a portion of a sampling channel, and is adapted to sample a phase current waveform 610-612 present at its input terminal 614, and to generate a stream 616 of digital waveform samples, which include the sets of corresponding samples. The stream 616 of digital waveform samples is provided to a controller (e.g., controller 110, FIG. 1), in an embodiment.

A-to-D converter 602 is electrically coupled to switching circuitry 606. Switching circuitry 606 may include, for example, circuitry adapted to receive multiple phase current waveforms at its input terminals, and to produce one of the received phase current waveforms at its output terminal. In an embodiment, switching circuitry 606 is adapted to receive each of the three phase current waveforms 610-612, and depending on the state of the switching circuitry 606, to provide one of the received phase current waveforms 610, 611 or 612 to A-to-D converter 602. Accordingly, A-to-D converter 602, in conjunction with switching circuitry 606, is adapted to sample each of the phase current waveforms 610-612.

Switching and timing signal generator 608 is adapted to provide switching inputs 630 to switching circuitry 606, which cause switching circuitry 606 to produce one of the received phase current waveforms 610-612 at its output terminal. In addition, switching and timing signal generator 608 is adapted to provide sample timing signals 632 to A-to-D converter 602, which controls the sampling instants at which A-to-D converter 602 will sample the phase current waveform present at its input terminal 614.

Figure 7:
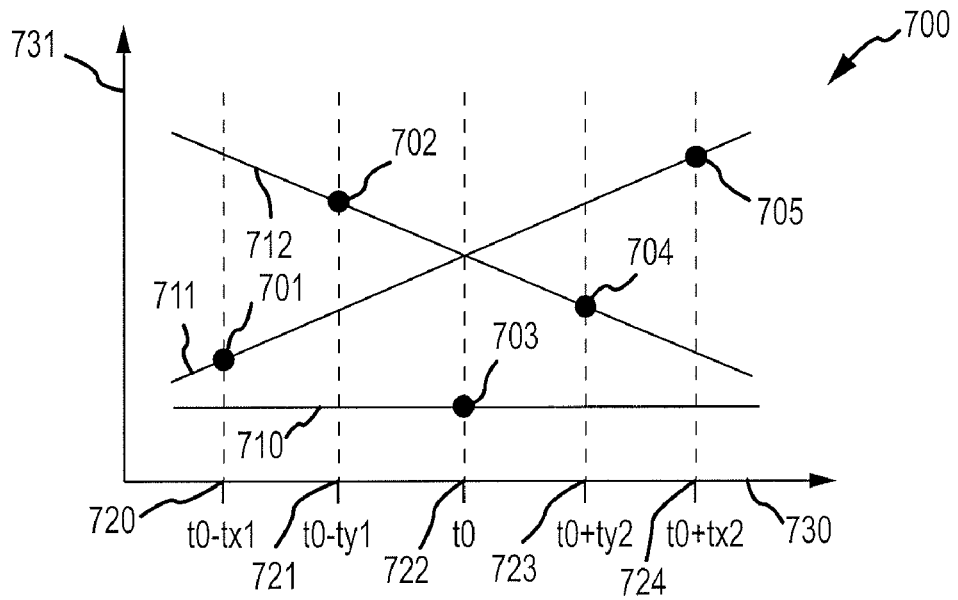
FIG. 7 is a chart illustrating sample points along three phase current waveforms, in accordance with another example embodiment.

FIG. 7 is a chart 700 illustrating sample points 701, 702, 703, 704, 705 along three phase current waveforms 710, 711, 712, where the sample points 701-705 correspond to various sampling instants 720, 721, 722, 723, 724, in accordance with another example embodiment. The axes of chart 700 include a time axis 730 and an amplitude axis 731. Chart 700 illustrates portions phase current waveforms 710-712 that are substantially shorter than the period of each phase current waveform 710-712.

Sampling instant 722 represents a reference sampling instant, t0. Substantially simultaneously with the reference sampling instant 722, a sample of a first phase current waveform 710 is generated, as indicated by sample point 703. This sample may be referred to herein as a "reference sample." The first phase current waveform 710 that is sampled at the reference sampling instant, t0, may be referred to herein as a "reference phase current waveform." The reference samples are generated using a first sampling channel, in an embodiment. For example, referring also to FIG. 6, switching and timing signal generator 608 may provide a sample timing signal 632 that causes A-to-D converter 602 to generate a sample of the first phase current waveform present at its input terminal 614. Which phase current waveform is present at the input terminal 614 of A-to-D converter 602 depends on the state of switching circuitry 606. In the state illustrated in FIG. 6, phase current waveform 610 will be present at the input terminal 614 of A-to-D converter 602.

Sample points 701 and 705 correspond to samples of a second phase current waveform 711, and sample points 702 and 704 correspond to samples of a third phase current waveform 712. Sampling instants 720, 721 represent sampling instants, t0−tx1 and t0−ty1, which occur before the reference sampling instant, t0, and sampling instants 723, 724 represent sampling instants, t0+ty2 and t0+tx2, which occur after the reference sampling instant, t0. Accordingly, sampling instants 720, 721, 723, and 724 may be referred to herein as "offset" sampling instants, and the samples corresponding to the offset sampling instants may be referred to as "offset samples." Phase current waveforms 711 and 712, which are not sampled at the reference sampling instant, may be referred to herein as first and second "non-reference phase current waveforms," respectively.

The values tx1, ty1, ty2, and tx2 are referred to herein as "sample timing offsets." Sample timing offsets, tx1, ty1, ty2, and tx2, are values in a range of about 5% to about 10% of the period of phase current waveforms 710-712, in an embodiment, although the sample timing offsets may be longer or shorter, in other embodiments. In an embodiment, tx1=tx2, and accordingly sampling instants 720 and 724 occur symmetrically, in time, before and after the reference timing instant, t0. In addition, in an embodiment, ty1=ty2, and accordingly sampling instants 721 and 723 also occur symmetrically, in time, before and after the reference timing instant, t0. In other embodiments, the sample timing offsets, tx1 and tx2, and/or the sample timing offsets, ty1 and ty2, may be unequal, and accordingly sampling instants 720 and 724 and/or 721 and 723 may occur asymmetrically, in time, before and after the reference timing instant, t0. In a further embodiment, tx1>ty1, and tx2>ty2, although other relationships between the sample timing offsets may be defined, in other embodiments.

In an embodiment, the samples corresponding to sample points 701-705 are generated using a single sampling channel that is adapted to receive the first, second or third phase current waveform 710-712, depending on the state of the switching circuitry (e.g., switching circuitry 606, FIG. 6). For example, referring again to FIG. 6, switching and timing signal generator 608 may provide a switching input 630 to switching circuitry 606, which causes the input and output terminals of switching circuitry 606 to produce either the first, second or third phase current waveform. For example, the switching circuitry 606 may be sequentially controlled as follows:

1) Prior to offset sampling instant 720, the state of switching circuitry 706 may be switched so that phase current waveform 711 will be present at the input terminal 614 of A-to-D converter 602 when offset sampling instant 720 occurs;

2) After offset sampling instant 720 and prior to offset sampling instant 721, the state of switching circuitry 606 may be switched so that phase current waveform 712 will be present at the input terminal 614 of A-to-D converter 602 when the offset sampling instant 721 occurs;

3) After offset sampling instant 721 and prior to reference sampling instant 722, the state of switching circuitry 606 may be switched so that phase current waveform 710 will be present at the input terminal 614 of A-to-D converter 602 when the reference sampling instant 722 occurs;

4) After reference sampling instant 722 and prior to offset sampling instant 723, the state of switching circuitry 606 may be switched so that phase current waveform 712 again will be present at the input terminal 614 of A-to-D converter 602 when the offset sampling instant 723 occurs;

5) After offset sampling instant 723 and prior to offset sampling instant 724, the state of switching circuitry 606 may be switched so that phase current waveform 711 again will be present at the input terminal 614 of A-to-D converter 602 when the offset sampling instant 724 occurs; and 6) The process may then repeat for a next set of corresponding samples.

For one set of corresponding samples, Table 3, below, indicates the relative timing and sequence of samples that are included within a stream of samples generated by A-to-D converter 602. For convenience, the samples are indicated by the reference numbers corresponding to sample points 701-705. The notation "$i_{x\_sample\_70y}$" indicates a sample value corresponding to the "$x_{th}$" phase current waveform (i.e., x=1, 2 or 3) at a particular sampling instant 70y.

TABLE 3

| | instant | | | | |
|---|---|---|---|---|---|
| | t0 − tx1 | t0 − ty1 | t0 | t0 + ty1 | t0 + tx2 |
| stream | $i_{2\_sample\_701}$ | $i_{3\_sample\_702}$ | $i_{1\_sample\_703}$ | $i_{3\_sample\_704}$ | $i_{2\_sample\_705}$ |

Referring also to FIG. 1, a stream 140 of phase current waveform samples (e.g., stream 616, FIG. 6) is received by controller 110. The phase current waveform sample that corresponds to the reference sampling instant, t0 (e.g., reference sampling instant 722, FIG. 7), indicates the amplitude of the reference phase current waveform (e.g., phase current waveform 710, FIG. 7). The phase current waveform samples (e.g., the offset samples) that correspond to the offset sampling instants, t0−tx1, t0−ty1, t0−ty2, and t0+tx2 (e.g., offset sampling instants 720, 721, 723, 724, FIG. 7), indicate two amplitudes for each of the second and third phase current waveforms, which were sampled at the offset sampling instants.

In an embodiment, processor 150 mathematically calculates an approximate amplitude value for the second and third phase current waveforms (e.g., phase current waveforms 611, 612, FIG. 6) at the reference sampling instant, t0, based on the values of the offset samples. In a particular embodiment, processor 150 calculates the approximate amplitude value for the second and third phase current waveforms as an average of the two offset samples for the second and third phase current waveforms, respectively. Using the annotation specified above, the approximate amplitude values, $i_{2approx}$ and $i_{3approx}$, for the second and third phase current waveforms may be calculated as follows:

$$i_{2approx} = \frac{1}{2}(i_{2\_sample\_701} + i_{2\_sample\_705}); \text{ and}$$

$$i_{3approx} = \frac{1}{2}(i_{3\_sample\_702} + i_{3\_sample\_704}).$$

In other embodiments, other linear or non-linear mathematical formulas may be used to calculate the approximate amplitude values for the second and third phase current waveforms.

Accordingly, for a given set of corresponding samples, processor 150 produces a modified set of samples that includes a single value for each of the phase current waveforms. One of the samples in the modified set includes the received amplitude value for the reference phase current waveform (e.g., $i_{1\_sample\_703}$), and the second and third samples in the set include calculated amplitude values for the second and third phase current waveforms (e.g., $i_{2approx}$ and $i_{3approx}$). Processor 150 (or controller 110) may store modified sets of samples for a plurality of reference sampling instants, and accordingly may accumulate a plurality of modified sample sets over time. The plurality of modified sample sets represents measurements of the three phase current waveforms over time, or the measured phase current waveforms. As discussed previously, based on errors calculated between the measured phase current waveform parameters and the desired phase current waveform parameters, processor 150 generates regulator control inputs 160 adapted to reduce the errors.

Figure 8:
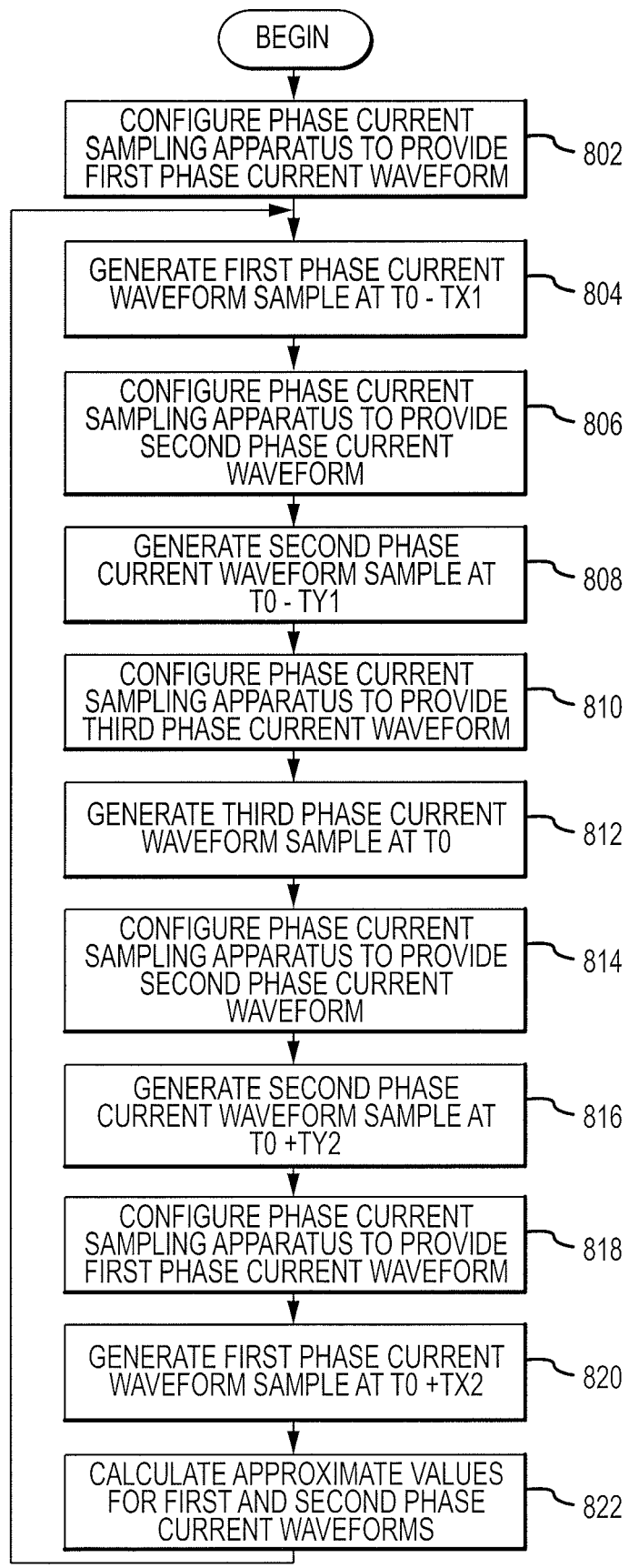
FIG. 8 illustrates a flowchart of a method for sampling phase currents, in accordance with another example embodiment.

FIG. 8 illustrates a flowchart of a method for sampling phase current waveforms, in accordance with another example embodiment. The method may be performed, for example, by portions of an electric motor drive system, such as various embodiments of the electric motor drive system and portions thereof discussed previously in conjunction with FIGS. 1, 6, and 7. The method may be carried out by hardware, software, firmware, and/or various combinations thereof, in various embodiments.

The method may begin, in block 802, by configuring the phase current sampling apparatus to provide a first, non-reference phase current waveform to a sampling channel of a phase current sampling apparatus (e.g., phase current sampling apparatus 108, FIG. 1). For example, referring also to FIGS. 1, 6, and 7, switching circuitry associated with the phase current sampling apparatus (e.g., switching circuitry 606, FIG. 6) may be controlled to provide the first, non-reference phase current waveform at an input terminal of an A-to-D converter (e.g., A-to-D converter 602, FIG. 6) associated with the first sampling channel.

In block 804, the first sampling channel generates a first offset sample of the first, non-reference phase current waveform at a first offset sampling instant (e.g., t0−tx1). For example, the A-to-D converter may receive a sample timing signal (e.g., sample timing signal 632, FIG. 6), and in response to the sample timing signal, the A-to-D converter may generate a sample of the first, non-reference phase current waveform.

In block 806, the phase current sampling apparatus may be configured to provide a second, non-reference phase current waveform to the sampling channel, and in block 808, the first sampling channel generates a first offset sample of the second, non-reference phase current waveform at a second offset sampling instant (e.g., t0−ty1).

In block 810, the phase current sampling apparatus may be configured to provide the reference phase current waveform to the sampling channel, and in block 812, the first sampling channel generates a sample of the reference phase current waveform at a reference sampling instant (e.g., t0).

In block 814, the phase current sampling apparatus may be configured again to provide the second, non-reference phase current waveform to the sampling channel, and in block 816, the first sampling channel generates a second offset sample of the second, non-reference phase current waveform at a third offset sampling instant (e.g., t0+ty2).

In block 818, the phase current sampling apparatus may be configured again to provide the first, non-reference phase current waveform to the sampling channel, and in block 820, the first sampling channel generates a second offset sample of the first, non-reference phase current waveform at a fourth offset sampling instant (e.g., t0+tx2).

In block 822, approximate values of the non-reference phase current waveforms, at the reference sampling instant, t0, may be calculated based on the offset samples for the non-reference phase current waveforms. As discussed previously, for example, a processor (e.g., processor 150, FIG. 1) may mathematically calculate an approximate amplitude value for each non-reference phase current waveform at the reference sampling instant, t0, based on the values of the offset samples corresponding to the non-reference phase current waveform. In a particular embodiment, the processor may calculate the approximate amplitude value for a non-reference phase current waveform as an average of the offset samples corresponding to the non-reference phase current waveform.

The approximate values of the non-reference phase current waveforms, along with the reference sample of the reference phase current waveform, form a modified set of samples that includes a single value for each of the phase current waveforms. In an embodiment, a plurality of sets of samples are generated and analyzed, and the electric motor drive system is controlled according to the analysis. Accordingly, the method may iterate, as illustrated in FIG. 8, in order to generate the plurality of sets of samples. Analysis of the samples will be discussed in more detail in conjunction with FIG. 9.

Figure 9:
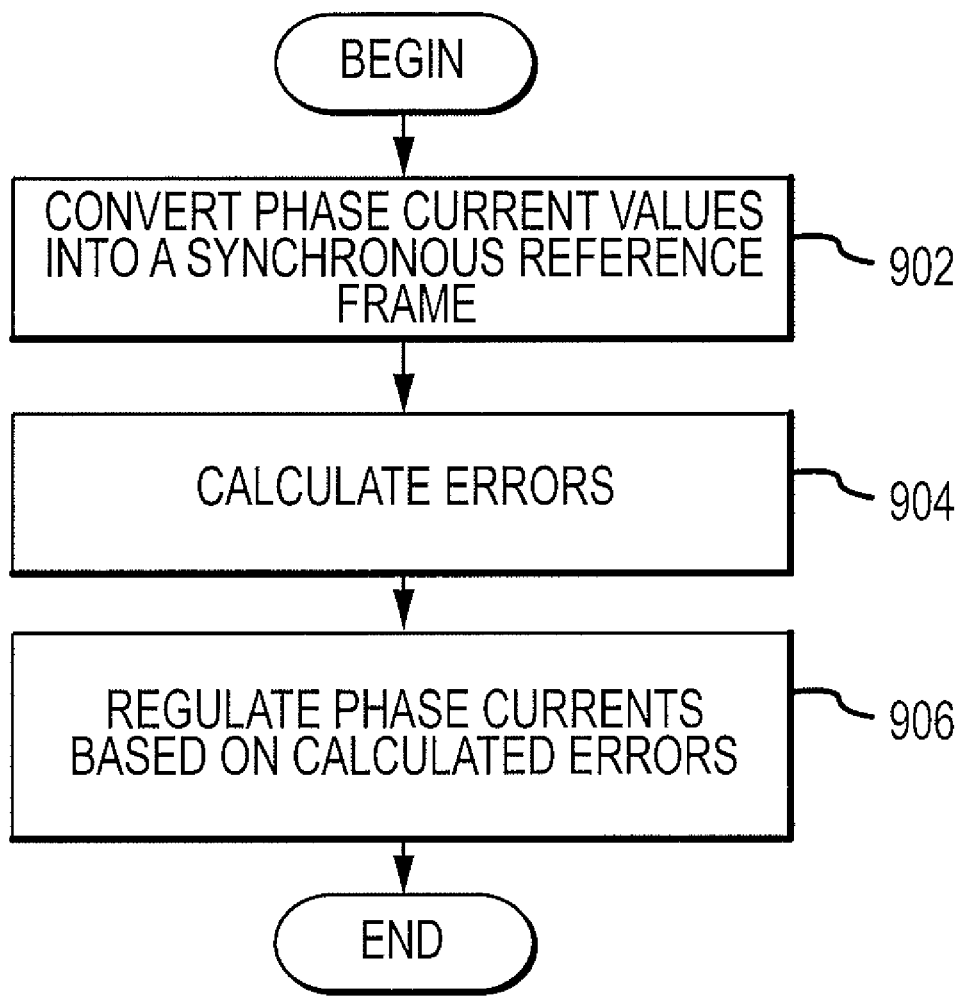
FIG. 9 illustrates a flowchart of a method for regulating phase currents, in accordance with an example embodiment.

FIG. 9 illustrates a flowchart of a method for regulating phase currents, in accordance with an example embodiment. The method may be performed, for example, by portions of an electric motor drive system, such as various embodiments of the electric motor drive system and portions thereof discussed previously in conjunction with FIG. 1 and elsewhere. The method may be carried out by hardware, software, firmware, and/or various combinations thereof, in various embodiments.

The method may begin, for example, during and after the accumulation of a plurality of sets of phase current waveform samples, each of which includes at least one approximate value of a non-reference phase current waveform, according to embodiments discussed in detail above. In an embodiment, the method begins, in block 902, by converting a plurality of sets of phase current waveform samples into a synchronous reference frame. For example, a plurality of sets of phase current waveform samples may represent three phase currents over a period of time. When converted into a synchronous reference frame, such as a two-axis dq synchronous reference frame, the synchronous frame currents (i.e., the d and q currents) may be represented.

Figure 10:
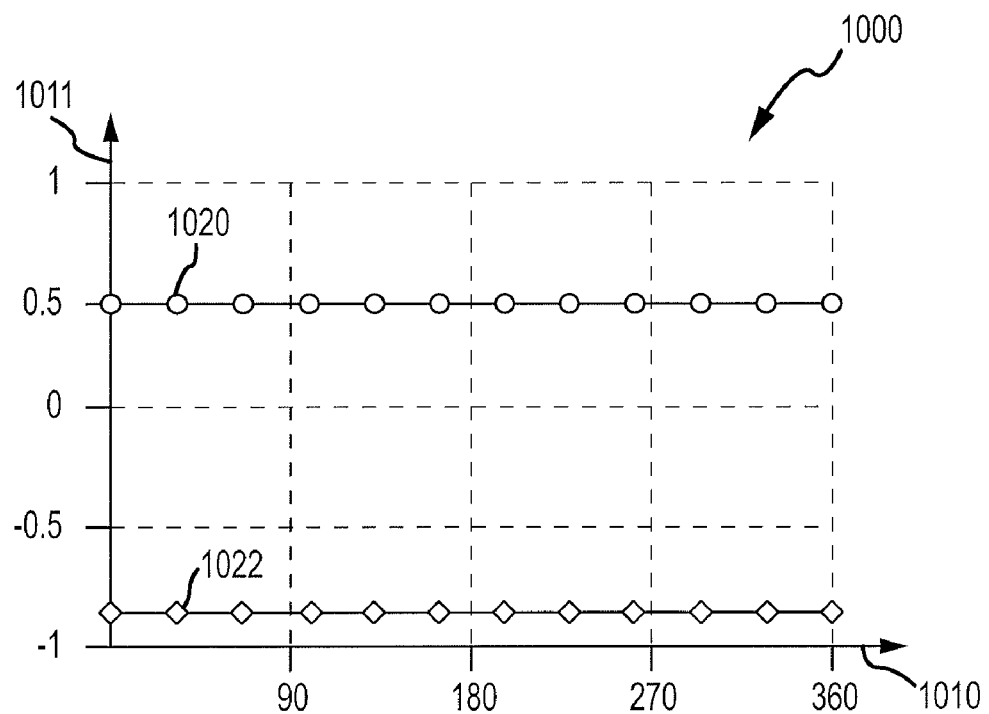
FIG. 10 is a chart illustrating an example of sampled, synchronous frame currents, in accordance with an example embodiment.

FIG. 10 is a chart 1000 illustrating an example of sampled, synchronous frame currents, in accordance with an example embodiment. The axes of chart 1000 include an electrical position axis 1010 and an amplitude axis 1011. Samples 1020 (indicated by circles) represent q current values, and samples 1022 (indicated by diamonds) represent d current values. Using embodiments of the inventive subject matter, the synchronous frame currents do not exhibit significant amplitude variations (e.g., "wobble"), wherein significant amplitude variations may be present using conventional sampling techniques.

Referring again to FIG. 9, in block 904, errors in the synchronous frame currents may be calculated. In an embodiment, this calculation includes comparing each of the d current values and the q current values from the synchronous reference frame with desired values for the d and q currents.

Figure 11:
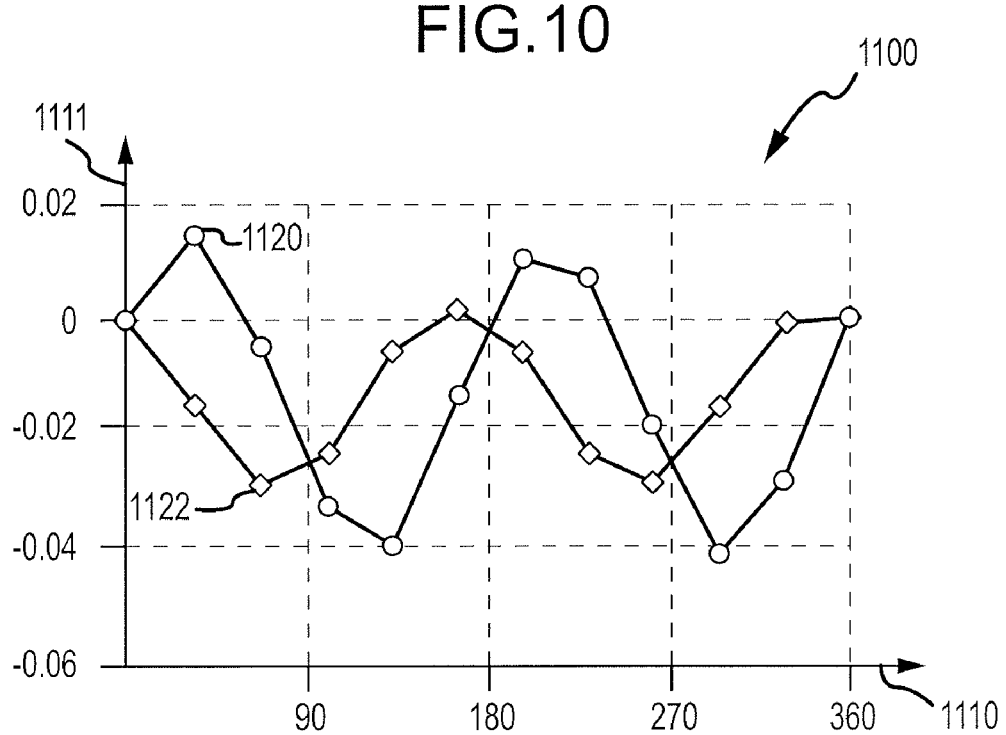
FIG. 11 is a chart illustrating an example of error plots for d and q currents, in accordance with an example embodiment.

FIG. 11 is a chart 1100 illustrating an example of error plots for the d and q currents, in accordance with an example embodiment. The axes of chart 1100 include an electrical position axis 1110 and an error axis 1111, indicated in percent. Points 1120 (indicated by circles) represent errors in the q current, and points 1122 (indicated by diamonds) represent errors in the d current. Using embodiments of the inventive subject matter, the synchronous frame currents may exhibit significantly smaller error percentages than are present using conventional sampling techniques.

Referring again to FIG. 9, in block 906, the phase currents (e.g., phase currents 118, FIG. 1) may be regulated, based on the calculated errors, in order to reduce the errors. Regulation may include, for example, the processor (e.g., processor 150, FIG. 1) providing commands, data or other regulator control inputs (e.g., regulator control inputs 160, FIG. 1), which enable the regulator (e.g., regulator 152, FIG. 1) to generate inverter control inputs (e.g., inverter control inputs 152, FIG. 1) that may tend to reduce the errors in the d and q currents, an thus in the phase currents. The method may then end.

Embodiments of the inventive subject matter may be incorporated into any of a number of systems that include one or more electric motors. For example, but not by way of limitation, embodiments of the inventive subject matter may be implemented in motor vehicle applications in which one or more electric motors are used to provide torque to other vehicle components, such as electric motor vehicles and hybrid electric vehicles (HEVs).

Figure 12:
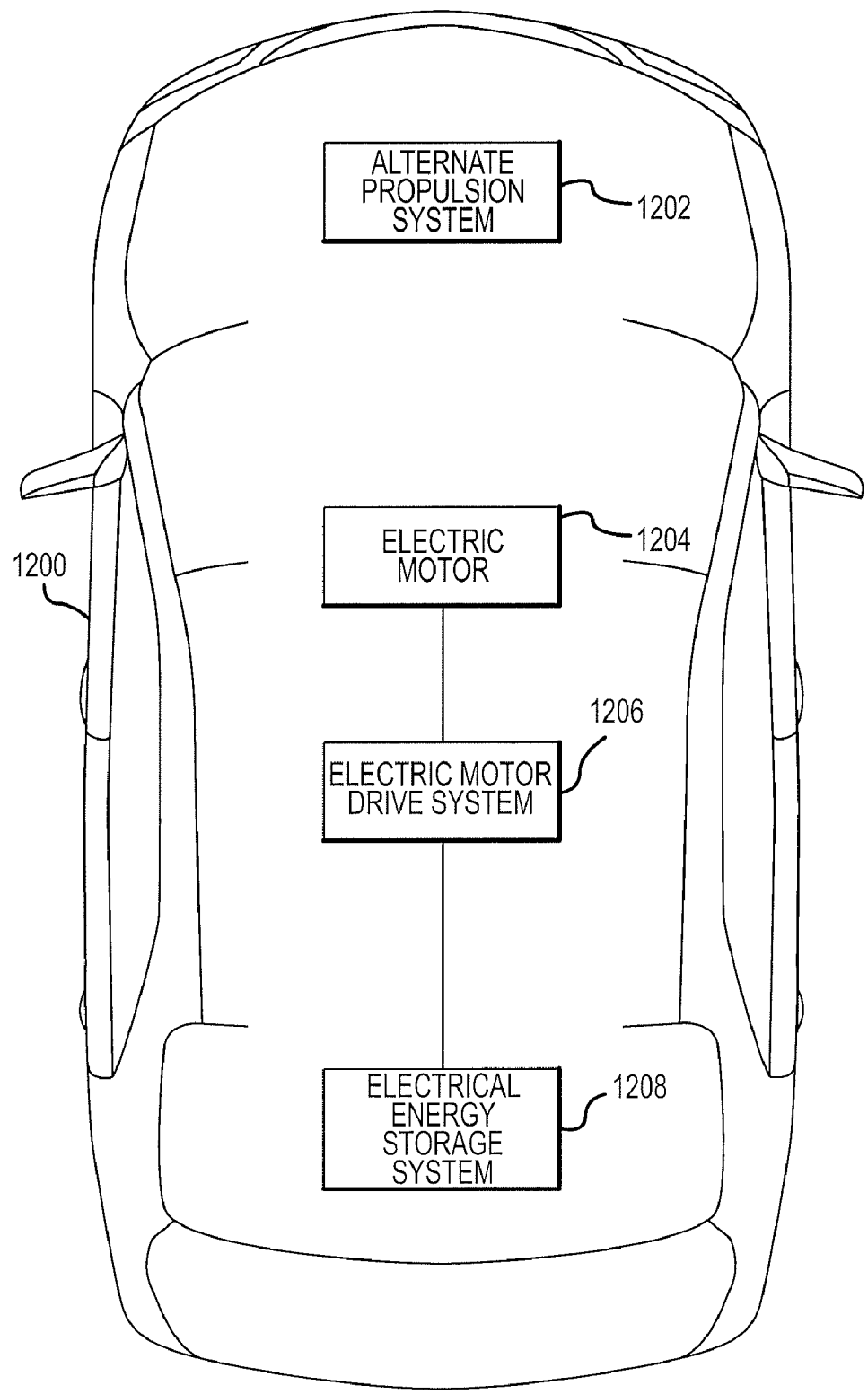
FIG. 12 illustrates a simplified diagram of an electric motor drive system installed in a hybrid electric vehicle, in accordance with an example embodiment.

FIG. 12 illustrates a simplified diagram of an electric motor drive system installed in an HEV 1200, in accordance with an example embodiment of the inventive subject matter. Vehicle 1200 includes an internal combustion engine, fuel cell, flex fuel engine, or other alternate propulsion system 1202, at least one electric motor 1204, at least one electric motor drive system 1206, and one or more electrical energy storage systems 1208 (e.g., batteries or supercapacitors). The alternate propulsion system 1202 and electric motor 1204 may alternatively or simultaneously provide torque to the drive train and/or other components (not illustrated) of vehicle 1200. In an all-electric vehicle, the alternate propulsion system 1202 may be excluded. Electrical energy storage system 1208 may form a portion of a rechargeable energy storage system adapted to provide energy at least to the electric motor drive system 1206.

Electric motor drive system 1206 includes one or more embodiments of the inventive subject matter, as discussed herein. Accordingly, electric motor drive system 1206 is adapted to generate multiple phase current waveforms, to sample and analyze the multiple phase current waveforms, and to control generation of the phase current waveforms based on the sampling and analysis. This, in turn, will affect the torque produced by electric motor 1204.

Along with motor vehicle applications, embodiments of the inventive subject matter also may be implemented in a variety of other types of systems in which multiple phase currents are sampled and evaluated in the process of phase current regulation. For example, but not by way of limitation, embodiments of the inventive subject matter may be implemented in industrial applications, and/or other types of motion control applications. Accordingly, such implementations and embodiments are intended to be included within the scope of the inventive subject matter.

While at least one exemplary embodiment has been presented in the foregoing detailed description, it should be appreciated that a vast number of variations exist. For example, although FIGS. 3 and 6 illustrate switching circuitry (e.g., switching circuitry 306, 606) adapted to selectively provide one of multiple phase current waveforms to a single A-to-D converter (e.g., A-to-D converters 302, 602), additional switching circuitry may be provided to selectively provide one of multiple phase current waveforms to one or more other A-to-D converters, in other embodiments. Also in other embodiments, switching circuitry may be employed to selectively provide one of more than three phase current waveforms. The embodiments of phase current sampling apparatus and methods described herein may be scaled upward or downward to accommodate sampling and analysis of more or fewer than three phase current waveforms. Further, although various system components have been illustrated to be electrically, physically or operatively coupled to certain other system components and/or to form portions of certain subsystems (e.g., a phase current sampling apparatus or a system controller), it is to be understood that some system components may be electrically, physically or operatively coupled in other ways than the above described and illustrated embodiments, and/or the system components may form portions of other sub-systems, and/or the system components may not be associated with any particular sub-system (e.g., they may be discrete components).

The exemplary embodiments are only examples, and are not intended to limit the scope, applicability, or configuration of the inventive subject matter in any way. Rather, the foregoing detailed description will provide those skilled in the art with a convenient road map for implementing the exemplary embodiment or exemplary embodiments. It should be understood that various changes can be made in the function and arrangement of elements without departing from the scope of the inventive subject matter as set forth in the appended claims and the legal equivalents thereof.

What is claimed is:

1. A phase current sampling apparatus comprising:
    switching circuitry having multiple input terminals and an output terminal, wherein the switching circuitry is adapted to receive multiple phase current waveforms that include at least a first phase current waveform and a second phase current waveform, and to provide the first phase current waveform at the output terminal during at least two offset sampling instants, and to provide the second phase current waveform at the output terminal during a reference sampling instant; and
    a first analog-to-digital converter adapted to receive the first phase current waveform and the second phase current waveform, and to generate digital values representing amplitudes of the first phase current waveform at the offset sampling instants, and to generate a digital value representing an amplitude of the second phase current waveform at the reference sampling instant.

2. The phase current sampling apparatus of claim 1, further comprising:
    a second analog-to-digital converter adapted to receive a third phase current waveform, and to generate a digital value representing an amplitude of the third phase current waveform at the reference sampling instant.

3. The phase current sampling apparatus of claim 1, wherein the multiple phase current waveforms include two phase current waveforms, and the multiple input terminals include two input terminals.

4. The phase current sampling apparatus of claim 1, wherein the multiple phase current waveforms include three phase current waveforms, and the multiple input terminals include three input terminals, and wherein the switching circuitry is further adapted to provide a third phase current waveform at the output terminal during at least two other offset sampling instants, and wherein the first analog-to-digital converter is adapted to receive the third phase current waveform, and to generate digital values representing amplitudes of the third phase current waveform at the other offset sampling instants.

5. The phase current sampling apparatus of claim 1, wherein the offset sampling instants include a first offset sampling instant and a second sampling instant, which occur substantially symmetrically before and after the reference sampling instant.

6. An electric motor drive system comprising:
    an inverter adapted to generate, based on inverter control inputs, multiple phase current waveforms, which include at least a first phase current waveform and a second phase current waveform;
    a phase current sampling apparatus having
        switching circuitry having multiple input terminals and an output terminal, wherein the switching circuitry is adapted to receive the multiple phase current waveforms, and to provide the first phase current waveform at the output terminal during at least two offset sampling instants, and to provide the second phase current waveform at the output terminal during a reference sampling instant, and
        a first analog-to-digital converter adapted to receive the first phase current waveform and the second phase current waveform, and to generate digital values representing amplitudes of the first phase current waveform at the offset sampling instants, and to generate a digital value representing an amplitude of the second phase current waveform at the reference sampling instant; and
    a controller adapted to receive the digital values representing the amplitudes of the first phase current waveform, and to calculate an approximate value for the first phase current waveform from the digital values representing the amplitudes of the first phase current waveform.

7. The electric motor drive system of claim 6, wherein the controller comprises:
    a processor adapted to perform an analysis of the approximate value and the digital value representing the amplitude of the second phase current waveform, and to generate regulator control inputs based on the analysis; and
    a regulator adapted to receive the regulator control inputs and to generate the inverter control inputs based on the regulator control inputs.

8. The electric motor drive system of claim 6, wherein the phase current sampling apparatus further comprises:
    a second analog-to-digital converter adapted to receive a third phase current waveform, and to generate a digital value representing an amplitude of the third phase current waveform at the reference sampling instant.

9. The electric motor drive system of claim 8, wherein the controller is further adapted to receive the digital values representing the amplitude of the third phase current waveform, and the controller comprises:

a processor adapted to perform an analysis of the approximate value, the digital value representing the amplitude of the second phase current waveform, and the digital value representing the amplitude of the third phase current waveform, and to generate regulator control inputs based on the analysis; and a regulator adapted to receive the regulator control inputs and to generate the inverter control inputs based on the regulator control inputs.

10. A motor vehicle comprising:

an electric motor adapted to receive multiple phase current waveforms and to provide torque in response to the multiple phase current waveforms, which include at least a first phase current waveform and a second phase current waveform; and an electric motor drive system having
an inverter adapted to generate, based on inverter control inputs, the multiple phase current waveforms,
a phase current sampling apparatus having
switching circuitry having multiple input terminals and an output terminal, wherein the switching circuitry is adapted to receive the multiple phase current waveforms, and to provide the first phase current waveform at the output terminal during at least two offset sampling instants, and to provide the second phase current waveform at the output terminal during a reference sampling instant, and
a first analog-to-digital converter adapted to receive the first phase current waveform and the second phase current waveform, and to generate digital values representing amplitudes of the first phase current waveform at the offset sampling instants, and to generate a digital value representing an amplitude of the second phase current waveform at the reference sampling instant, and a controller adapted to receive the digital values representing the amplitudes of the first phase current waveform, and to calculate an approximate value for the first phase current waveform from the digital values representing the amplitudes of the first phase current waveform.

11. The motor vehicle of claim 10, wherein the electric motor is adapted to receive three phase current waveforms.

12. The motor vehicle of claim 10, further comprising:
an alternate propulsion system adapted to provide torque alternatively to or simultaneously with the electric motor.

13. A method for regulating phase current waveforms comprising the steps of:
generating, by a first analog-to-digital converter, a first sample of a first phase current waveform at a first offset sampling instant that occurs a first timing offset, tx1, before a reference sampling instant, t0;

generating, by the first analog-to-digital converter, a second sample of a second phase current waveform at the reference sampling instant;

generating, by the first analog-to-digital converter, a third sample of the first phase current waveform at a second offset sampling instant that occurs a second timing offset, tx2, after the reference sampling instant;

performing an analysis of the first sample, the second sample, and the third sample; and regulating the phase current waveforms based on the analysis.

14. The method of claim 13, further comprising the step of:
generating, by a second analog-to-digital converter, a fourth sample of a third phase current waveform at the reference sampling instant.

15. The method of claim 13, further comprising the step of:
calculating an approximate value of the first phase current waveform at the reference sampling instant based on the first sample and the third sample.

16. The method of claim 15, wherein tx1 is substantially equal to tx2, and calculating comprises the step of:
calculating an average of the first sample and the third sample, wherein the average represents an approximate value of the first phase current waveform at the reference sampling instant.

17. The method of claim 13, further comprising the steps of:
generating, by the first analog-to-digital converter, a fourth sample of a third phase current waveform at a third offset sampling instant that occurs a third timing offset, ty1, before the reference sampling instant; and generating, by the first analog-to-digital converter, a fifth sample of the third phase current waveform at a fourth offset sampling instant that occurs a fourth timing offset, ty2, after the reference sampling instant.

18. The method of claim 17, wherein tx1 is substantially equal to tx2, and wherein ty1 is substantially equal to ty2, the method further comprising the steps of:
calculating a first average of the first sample and the third sample, wherein the first average represents an approximate value of the first phase current waveform at the reference sampling instant; and calculating a second average of the fourth sample and the fifth sample, wherein the second average represents an approximate value of the third phase current waveform at the reference sampling instant.

19. The method of claim 13, wherein performing the analysis comprises the step of:
calculating an average of the first sample and the third sample, wherein the average represents an approximate value of the first phase current waveform at the reference sampling instant.

* * * * *